US012765031B2

(12) United States Patent
Nagaoka et al.

(10) Patent No.: US 12,765,031 B2
(45) Date of Patent: Oct. 13, 2026

(54) SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Tatsuji Nagaoka, Nisshin (JP); Hiroki Miyake, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 458 days.

(21) Appl. No.: 18/350,898

(22) Filed: Jul. 12, 2023

(65) Prior Publication Data

US 2024/0021681 A1 Jan. 18, 2024

(30) Foreign Application Priority Data

Jul. 15, 2022 (JP) ................................ 2022-114183

(51) Int. Cl.

| | |
|---|---|
| ***H10D 64/00*** | (2025.01) |
| ***H10D 8/50*** | (2025.01) |
| ***H10D 8/60*** | (2025.01) |
| ***H10D 62/10*** | (2025.01) |

(52) U.S. Cl.

CPC ............. *H10D 64/117* (2025.01); *H10D 8/50* (2025.01); *H10D 8/60* (2025.01); *H10D 62/105* (2025.01)

(58) Field of Classification Search

CPC ...... H10D 8/50; H10D 62/105; H10D 62/129; H10D 8/00; H10D 8/422; H10D 30/665; H10D 62/103; H10D 8/60–605; H10D 8/051; H10D 64/111–117; H10D 8/055

See application file for complete search history.

(56) References Cited

U.S. PATENT DOCUMENTS

| | | | | |
|---|---|---|---|---|
| 2016/0254392 | A1 | 9/2016 | Hasegawa | |
| 2017/0256657 | A1 | 9/2017 | Niwa et al. | |
| 2018/0114829 | A1 | 4/2018 | Nagaoka et al. | |
| 2018/0240864 | A1* | 8/2018 | Nagaoka ................ | H10D 99/00 |
| 2018/0240914 | A1* | 8/2018 | Nagaoka .............. | H10D 62/105 |
| 2019/0043999 | A1 | 2/2019 | Nagaoka et al. | |

* cited by examiner

*Primary Examiner* — Shahed Ahmed

(74) *Attorney, Agent, or Firm* — Posz Law Group, PLC

(57) ABSTRACT

A semiconductor device includes a semiconductor substrate having an element region and a peripheral region. The semiconductor substrate includes a high-concentration layer, a drift layer, and a low-concentration layer. The high-concentration layer extends from the element region to the peripheral region, and is in contact with a lower electrode. The high-concentration layer has a thin plate portion and a thick plate portion. The drift layer is in contact with the upper surface of the thick plate portion. The low-concentration layer extends from the element region to the peripheral region, and is in contact with an upper surface of the thin plate portion and a side surface of a stepped portion at a boundary between the thin plate portion and the thick plate portion. A half or more of a quadrilateral region in a cross section of the semiconductor substrate is not depleted.

11 Claims, 7 Drawing Sheets

SEMICONDUCTOR DEVICE

CROSS REFERENCE TO RELATED APPLICATION

This application is based on Japanese Patent Application No. 2022-114183 filed on Jul. 15, 2022, the disclosure of which is incorporated herein by reference.

TECHNICAL FIELD

The present disclosure relates to a semiconductor device.

BACKGROUND

In a semiconductor device, a semiconductor substrate may have an element region and a peripheral region. A recess may be provided at an upper surface of the semiconductor substrate in the peripheral region. Therefore, the upper surface of the semiconductor substrate protrudes in the element region more than in the peripheral region. The semiconductor device may have an upper electrode, a lower electrode, an insulation layer, and a field plate. The upper electrode may be in contact with the upper surface of the semiconductor substrate within the element region. The lower electrode may be in contact with a lower surface of the semiconductor substrate within the element region and within the peripheral region. The insulation layer may cover a side surface and a bottom surface of the recess. The field plate may extend from the upper electrode to the top of the peripheral region and face the side and bottom surfaces of the recess via the insulation layer. The semiconductor substrate may have an n-type high concentration layer, an n-type drift layer, and an n-type low concentration layer. The high-concentration layer may extend from the element region to the peripheral region and may be in contact with the lower electrode. The high concentration layer may have a thin plate portion and a thick plate portion. The upper surface of the thick plate portion may protrude further than the upper surface of the thin plate portion. The thick plate portion may be disposed within the element region. The thin plate portion may extend from the element region to the peripheral region. The drift layer may be arranged within the element region and may be in contact with the upper surface of the thick plate portion. The drift layer may have a Schottky barrier contact with the upper electrode. The drift layer may be connected to the upper electrode via a p-layer. A diode, for example, a Schottky barrier diode, a p-n diode may be formed between the drift layer and the upper electrode. The low-concentration layer may be in contact with the side surface of the drift layer, the upper surface of the thin plate portion, and a side surface of a stepped portion formed at the boundary between the thick plate portion and the thin plate portion. In this semiconductor device, an electric field concentration in the peripheral region may be suppressed by the field plate and the low-concentration layer. Further, in the semiconductor device described above, the high-concentration layer has the thin plate portion in the peripheral region that may ensure the thickness of the low-concentration layer above the thin plate portion. Thus, the breakdown voltage of the peripheral region may be improved.

SUMMARY

The present disclosure describes a semiconductor device including a semiconductor substrate, an upper electrode, a lower electrode, an insulation layer, and a field plate.

DETAILED DESCRIPTION

Figure 1:
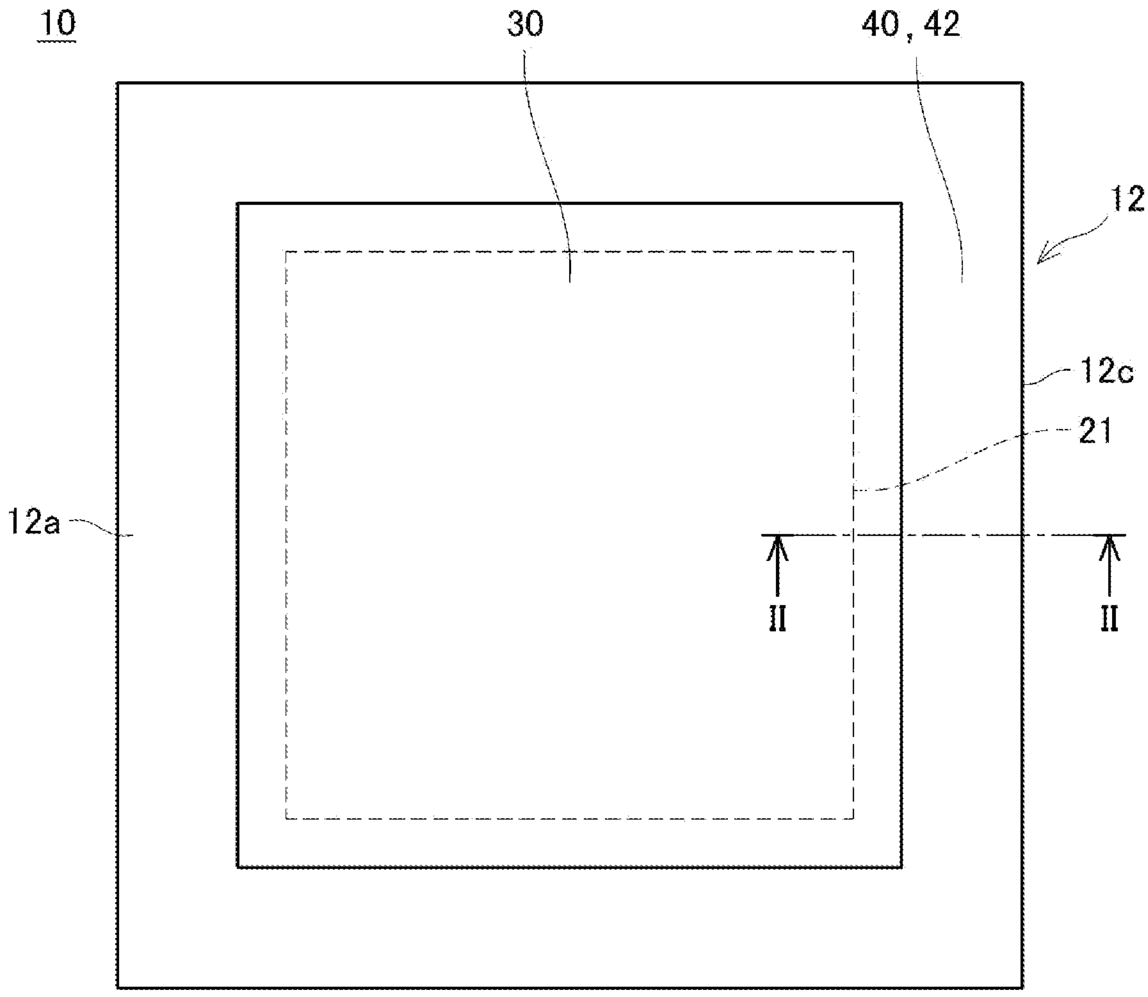
FIG. 1 is a plan view of a semiconductor device according to a first embodiment.

In a semiconductor device, a high-concentration layer of a semiconductor substrate may have a thick plate portion and a thin plate portion, and a stepped portion may be formed at a boundary between the thick plate portion and the thin plate portion. In the semiconductor device, an electric field may be concentrated around the upper end of the stepped portion when a drift layer and a low-concentration layer of the semiconductor substrate are depleted.

According to a first aspect of the present disclosure, a semiconductor device includes a semiconductor substrate, an upper electrode, a lower electrode, an insulation layer, and a field plate. The semiconductor substrate includes an element region and a peripheral region located around the element region. A recess is located at an upper surface of the semiconductor substrate in the peripheral region such that an upper surface of the semiconductor substrate in the element region protrudes further than the upper surface of the semiconductor substrate in the peripheral region. The upper electrode is in contact with the upper surface of the semiconductor substrate in the element region. The lower electrode is in contact with a lower surface of the semiconductor substrate in both of the element region and the peripheral region. The insulation layer covers a side surface and a bottom surface of the recess. The field plate extends from the upper electrode to an upper portion of the peripheral portion. The field plate is on a side opposite to the side surface and the bottom surface of the recess with the insulation layer interposed between the field plate and each of the side surface and the bottom surface of the recess. The semiconductor substrate includes a high-concentration layer, a drift layer, and a low-concentration layer, each of which is an n-type layer. The high-concentration layer extends from the element region to the peripheral region. The high-concentration layer is in contact with the lower electrode. The high-concentration layer has a thick plate portion and a thin plate portion. An upper surface of the thick plate portion protrudes further than an upper surface of the thin plate portion. The thick plate is located in the element region. The thin plate portion extends from the element region to the peripheral region. The drift layer is located in the element region and is in contact with the upper surface of the thick plate portion. The drift layer has a lower n-type impurity concentration than the high-concentration layer. The low-concentration layer extends from the element region to the peripheral portion. The low-concentration layer is in contact with a side surface of the drift layer. The low-concentration layer is in contact with the upper surface of the thin plate portion. The low-concentration layer is in contact with a side surface of a stepped portion located at a boundary between the thick plate portion and the thin plate portion. The low-concentration layer is in contact with the insulation layer at the side surface and the bottom surface of the recess. The low-concentration layer has a lower n-type impurity concentration than the drift layer. The drift layer is connected to the upper electrode through at least one of a p-n junction and a Schottky barrier junction. A cross section of the semiconductor substrate perpendicularly intersects the stepped portion, and the cross section of the semiconductor substrate includes a quadrilateral region surrounded by the side surface of the stepped portion, a first virtual line, the upper surface of the thin plate portion, and a second virtual line. The first virtual line is at a location shifted from the side surface of the stepped portion toward the peripheral portion by a distance identical to a height of the stepped portion, and the second virtual line is at a location shifted upward from the upper surface of the thin plate portion by a distance identical to the height of the stepped portion. A half or more of the quadrilateral region is not depleted in a case where an electric potential of the lower electrode with respect to the upper electrode is raised to an electric potential causing an avalanche breakdown in the semiconductor substrate.

In the semiconductor device according to the first aspect of the present disclosure, a half or more of the quadrilateral region is not depleted when a high voltage is applied, so the electric field concentration around the upper end of the stepped portion is suppressed. According to this structure, the electric field concentration inside the semiconductor substrate can be effectively suppressed, and the breakdown voltage of the semiconductor device can be improved.

In the semiconductor device according to the first aspect of the present disclosure, a region of the low-concentration layer below a straight line extending at an angle of 45 degrees from the upper end of the stepped portion to the upper surface of the thin plate portion may not be depleted, when an electric potential of the lower electrode with respect to the upper electrode is raised to an electric potential that causes avalanche breakdown in the semiconductor substrate.

According to the above structure, it is possible to further improve the breakdown voltage of the semiconductor device.

According to a second aspect of the present disclosure, a semiconductor device includes a semiconductor substrate, an upper electrode, a lower electrode, an insulation layer, and a field plate. The semiconductor substrate includes an element region and a peripheral region located around the element region. A recess is located at an upper surface of the semiconductor substrate in the peripheral region such that an upper surface of the semiconductor substrate in the element region protrudes further than the upper surface of the semiconductor substrate in the peripheral region. The upper electrode is in contact with the upper surface of the semiconductor substrate in the element region. The lower electrode is in contact with a lower surface of the semiconductor substrate in both of the element region and the peripheral region. The insulation layer covers a side surface and a bottom surface of the recess. The field plate extends from the upper electrode to an upper portion of the peripheral portion. The field plate is on a side opposite to the side surface and the bottom surface of the recess with the insulation layer interposed between the field plate and each of the side surface and the bottom surface of the recess. The semiconductor substrate includes a high-concentration layer, a drift layer, and a low-concentration layer, each of which is an n-type layer. The high-concentration layer extends from the element region to the peripheral region. The high-concentration layer is in contact with the lower electrode. The high-concentration layer has a thick plate portion and a thin plate portion. An upper surface of the thick plate portion protrudes further than an upper surface of the thin plate portion. The thick plate is located in the element region. The thin plate portion extends from the element region to the peripheral region. The drift layer is located in the element region and is in contact with the upper surface of the thick plate portion. The drift layer has a lower n-type impurity concentration than the high-concentration layer. The low-concentration layer extends from the element region to the peripheral portion. The low-concentration layer is in contact with a side surface of the drift layer. The low-concentration layer is in contact with the upper surface of the thin plate portion. The low-concentration layer is in contact with the insulation layer at the side surface and the bottom surface of the recess. The low-concentration layer has a lower n-type impurity concentration than the drift layer. The drift layer is connected to the upper electrode through at least one of a p-n junction and a Schottky barrier junction. A displacement portion in which an upper surface of the high-concentration layer gradually descends from the thick plate portion to the thin plate portion is located at a boundary between the thick plate portion and the thin plate portion. The low-concentration layer is in contact with the upper surface of the high-concentration layer in the displacement portion.

In the semiconductor described above, the depletion layer is gradually distributed along the upper surface of the high-concentration layer at the boundary, in other words, the displacement portion between the thick plate portion and the thin plate portion when a high voltage is applied. Therefore, the electric field concentration around the boundary between the thick plate portion and the thin plate portion is suppressed. According to the above structure, it is possible to effectively suppress the electric field concentration inside the semiconductor substrate, and it is possible to improve the breakdown voltage of the semiconductor device.

In the semiconductor device according to the first aspect or the second aspect of the present disclosure, the insulation layer may include a first insulation layer and a second insulation layer. The first insulation layer is in contact with the bottom surface of the recess. The second insulation layer is disposed on the first insulation layer, and the dielectric constant of the second insulation layer is different from that of the first insulation layer. The first insulation layer and the second insulation layer may be disposed between the field plate and the bottom surface of the recess.

According to the above structure, it is possible to enlarge the spacing between the field plate and the semiconductor substrate through the insulation layer made of double layers. In addition, it is possible to suppress the electric field concentration inside the insulation layer since the dielectric constant of one of the insulation layers can be increased.

However, the dielectric constant of the first insulation layer may be larger than that of the second insulation layer, and the insulation breakdown voltage of the second insulation layer may be larger than that of the first insulation layer.

According to the above structure, since the insulation breakdown voltage of the second insulation layer near the field plate is relatively large, it is possible to suppress the insulating breakdown of the insulation layer caused by the electric field concentration at the end portion of the field plate.

The insulation layer between the field plate and the side surface of the recess may be made of a single layer being either the first insulation layer or the second insulation layer.

According to the above structure, it is possible to relax the electric field concentration at the outer peripheral portion of the element region.

The insulation layer between the field plate and the side surface of the recess may be made of one of the first insulation layer and the second insulation layer that has a largest dielectric constant.

According to the above structure, it is possible to further relax the electric field concentration at the outer peripheral portion of the element region.

First Embodiment

Figure 2:
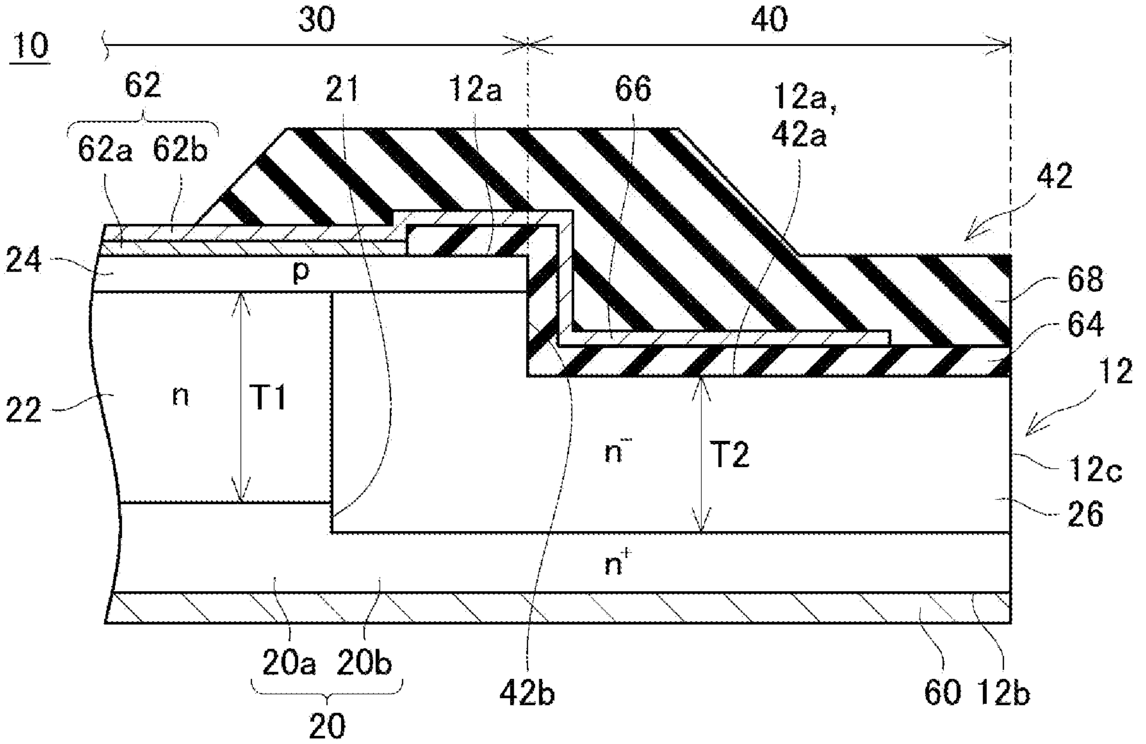
FIG. 2 is a cross-sectional view taken along line II-II in FIG. 1.

As illustrated in FIG. 1, a semiconductor device 10 according to a first embodiment includes a semiconductor substrate 12. The semiconductor substrate 12 is made of semiconductor material such as silicon (Si), silicon carbide (SiC), gallium nitride (GaN), and gallium(III) oxide ($Ga_2O_3$). In a top view of the semiconductor substrate 12, an element region 30 is provided in a central portion of the semiconductor substrate 12, and a peripheral region 40 is provided around the element region 30. The element region 30 is a region in which semiconductor elements such as a diode and a switching element are disposed. The peripheral region 40 is a region around the element region 30 for securing a breakdown voltage. As illustrated in FIG. 2, a recess 42 is located at an upper surface 12*a* of the semiconductor substrate 12. The recess 42 is located at the upper surface 12*a* in the entire peripheral region 40. The recess 42 is distributed from a position adjacent to the element region 30 to the outer peripheral end surface 12*c* of the semiconductor substrate 12. Therefore, the upper surface 12*a* in the element region 30 protrudes further than the upper surface 12*a* in the peripheral region 40, that is, a bottom surface 42*a* of the recess 42. The recess 42 may also be referred to as a recess portion.

A lower electrode 60 is provided at a lower portion of the semiconductor substrate 12. The lower electrode 60 covers substantially the entire lower surface 12*b* of the semiconductor substrate 12. The lower electrode 60 is in contact with the lower surface 12*b* in an area over the element region 30 and the peripheral region 40.

An upper electrode 62, a peripheral insulation layer 64, a field plate 66, and a protective insulation layer 68 are provided at an upper portion of the semiconductor substrate 12.

The upper electrode 62 has a first metal layer 62*a* and a second metal layer 62*b*. The first metal layer 62*a* is in contact with the upper surface 12*a* of the semiconductor substrate 12 within the element region 30. The second metal layer 62*b* is made of a metal different from the first metal layer 62*a*. The second metal layer 62*b* covers the upper surface of the first metal layer 62*a*.

The peripheral insulation layer 64 covers the bottom surface 42*a* and a side surface 42*b* of the recess 42. The peripheral insulation layer 64 covers a peripheral portion of the upper surface 12*a* within the element region 30. In the first embodiment, the peripheral insulation layer 64 is made of silicon oxide.

The field plate 66 is a portion extending the second metal layer 62*b* of the upper electrode 62 to the top of the peripheral region 40. The field plate 66 extends from the upper electrode 62 along the surface of peripheral insulation layer 64 to the top of the recess 42. The field plate 66 is located on a side opposite to the bottom surface 42*a* and side surface 42*b* of the recess 42 with the peripheral insulation layer 64 interposed therebetween.

The protective insulation layer 68 covers the outer periphery of the upper electrode 62, the field plate 66, and the outer periphery of the peripheral insulation layer 64.

The semiconductor substrate 12 has a cathode layer 20, a drift layer 22, an anode layer 24, and a high resistivity layer 26.

The cathode layer 20 is an n-type layer with a relatively high n-type impurity concentration. The cathode layer 20 is distributed over a range including the entire lower surface 12*b*. That is, the cathode layer 20 is distributed across the peripheral region 40 from the element region 30. In other words, the cathode layer 20 extends from the element region 30 to the peripheral region 40. The cathode layer 20 is in ohmic contact with the lower electrode 60 astride the element region 30 and the peripheral region 40. The cathode layer 20 has a thick plate portion 20*a* and a thin plate portion 20*b*. The thick plate portion 20*a* is arranged in the central portion of the element region 30. The thin plate portion 20*b* is distributed across the outer peripheral portion of the element region 30 and the peripheral region 40. In other words, the thin plate portion 20*b* extends from the element region 30 to the peripheral region 40. The upper surface of the thick plate portion 20*a* protrudes further than the upper surface of the thin plate portion 20*b*. Therefore, a stepped portion 21 is located between the upper surface of the thick plate portion 20*a* and the upper surface of the thin plate portion 20*b*. The stepped portion 21 is located at the boundary between the thick plate portion 20*a* and the thin plate portion 20*b*. As shown in FIG. 1, the stepped portion 21 extends in parallel with the outer peripheral end surface 12*c* of the semiconductor substrate 12 so as to encircle the center of the element region 30. As indicated by line II-II in FIG. 1, the cross sectional view in FIG. 2 is a view intersecting the stepped portion 21 perpendicularly.

The drift layer 22 is an n-type layer having a lower n-type impurity concentration than cathode layer 20. The drift layer 22 is arranged inside the element region 30. The drift layer 22 is arranged at an upper portion of the thick plate portion and is in contact with the upper surface of the thick plate portion 20*a*.

The high resistivity layer 26 is an n-type layer having a lower n-type impurity concentration than the drift layer 22. Since the high resistivity layer 26 has a lower n-type impurity concentration than drift layer 22, the high resistivity layer 26 has a higher resistivity than the drift layer 22. The high resistivity layer 26 is distributed across the outer peripheral portion of the element region 30 and the peripheral region 40. In other words, the high resistivity layer 26 extends from the element region 30 to the peripheral region 40. The high resistivity layer 26 is arranged on the upper portion of the thin plate portion 20*b* and is in contact with the upper surface of the thin plate portion 20*b*. The high resistivity layer 26 is in contact with the side surface of the stepped portion 21. The high resistivity layer 26 is in contact with the side surface of the drift layer 22. The high resistivity layer 26 is in contact with the peripheral insulation layer 64 at the bottom surface 42*a* and the side surface 42*b* of the recess 42.

The anode layer 24 is a p-type layer. The anode layer 24 is arranged within the element region 30. The anode layer 24 is distributed over a region including the entire upper surface 12*a* within the element region 30. The anode layer 24 is in contact with the upper surface of the drift layer 22 and the upper surface of the high resistivity layer 26 in the element region 30. A central portion of the anode layer 24 is in ohmic contact with the first metal layer 62*a* of the upper electrode 62. Therefore, the drift layer 22 is connected to the upper electrode 62 via a p-n junction, for example, a p-n junction between the drift layer 22 and the anode layer 24. The outer peripheral portion of the anode layer 24 is covered with the peripheral insulation layer 64 and is on a side opposite to the field plate 66 with the peripheral insulation layer 64 interposed therebetween.

A PIN diode is formed by the anode layer 24, the drift layer 22, and the cathode layer 20 in the element region 30. When the potential of the upper electrode 62 is made higher than the potential of the lower electrode 60, the PIN diode is turned on and a current flows from the upper electrode 62 through the anode layer 24, the drift layer 22 and the cathode layer 20 to the lower electrode 60.

When the potential of the lower electrode 60 is made higher than the potential of the upper electrode 62, a reverse voltage is applied to the p-n junction. As a result, a depletion layer extends from the p-n junction to the drift layer 22 and the high resistivity layer 26. A dashed line 70 in FIG. 3 indicates the distribution range of the depletion layer when a predetermined potential higher than the potential of the upper electrode 62 is applied to the lower electrode 60. Since the n-type impurity concentration of the high resistivity layer 26 is relatively low, a depletion layer tends to spread in the high resistivity layer 26. The field plate 66 suppresses the lateral potential difference in the high resistivity layer 26. As a result, the extension of the depletion layer in the lateral direction within the high resistivity layer 26 progresses. As a result, the electric field concentration around the side surface 42*b* of the recess 42 is suppressed. A dashed line 72 in FIG. 3 indicates the distribution range of the depletion layer when the potential of the lower electrode 60 is raised more than that of the dashed line 70. As shown by the dashed line 72, when the potential of the lower electrode 60 is increased, the distribution range of the depletion layer is widened. In the state of the dashed line 72, the depletion layer almost reaches the cathode layer 20. Therefore, if the potential of the lower electrode 60 is further increased from the state indicated by the dashed line 72, an avalanche breakdown occurs within the semiconductor substrate 12.

Figure 3:
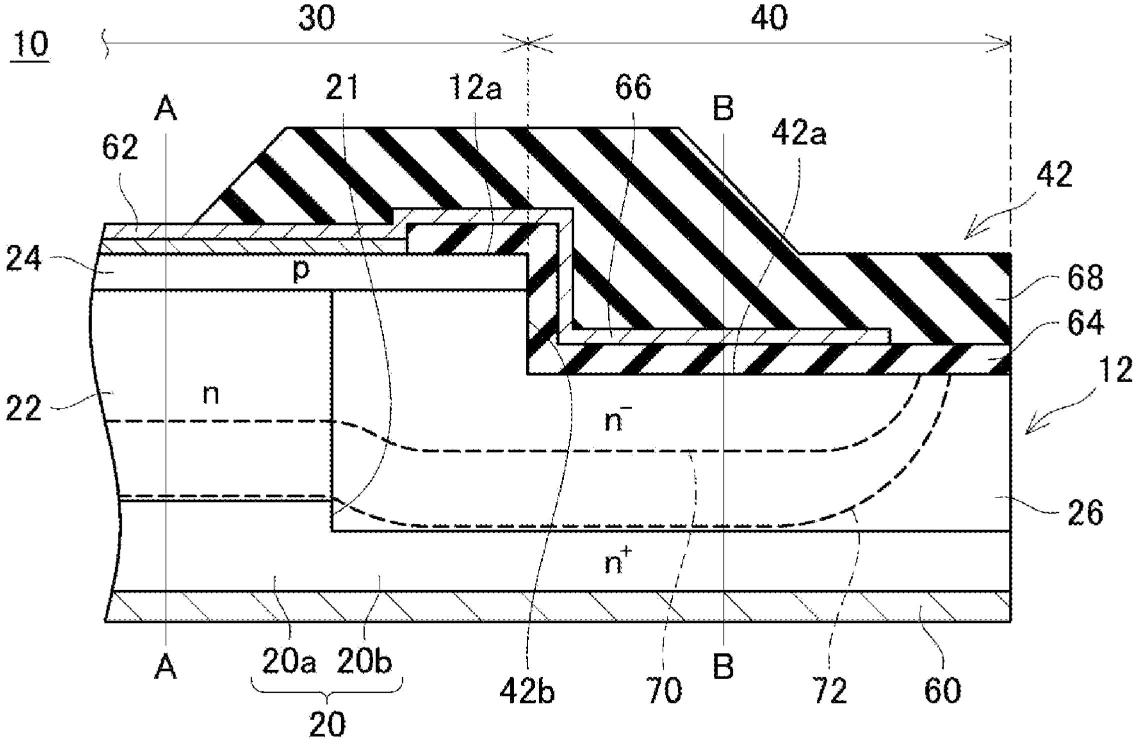
FIG. 3 is a cross-sectional view showing the distribution of a depletion layer in the cross section corresponding to FIG. 2.
Figure 4:
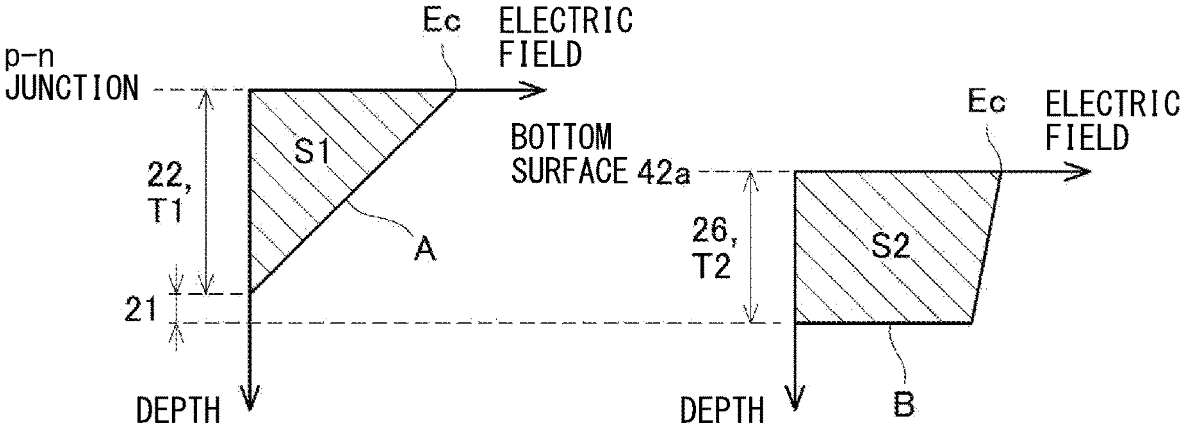
FIG. 4 is a graph showing the electric field distribution along lines AA and BB of FIG. 3.

FIG. 4 illustrates the electric field distribution along lines A-A and B-B in FIG. 3, in a state where the depletion layer is distributed as indicated by the dashed line 72. Graph A in FIG. 4 illustrates the electric field distribution at the position of the line A-A, and illustrates that the origin of graph A is the position of the p-n junction. Graph B in FIG. 4 illustrates the electric field distribution at the position along the line B-B, and illustrates that the origin of graph B is the position of the bottom surface 42*a* of the recess 42. At the position along the line A-A (that is, within the drift layer 22), the electric field gradually decreases from the maximum electric field Ec from the upper end to the lower end of the drift layer 22 due to the influence of fixed charges existing in the depletion layer. Since the n-type impurity concentration of the high resistivity layer 26 is low, very few fixed charges exist in the high resistivity layer 26. Therefore, an electric field being substantially equal to the maximum electric field Ec is generated from the upper end to the lower end of the high resistivity layer 26 at the position of the line B-B (that is, inside the high resistivity layer 26). The respective shaded areas S1, S2 of the graphs A, B in FIG. 4 correspond to voltages respectively held at the drift layer 22 and the high resistivity layer 26. As illustrated in FIG. 4, the voltage that can be held by the drift layer 22 is the area S1 of the triangular region defined by the graph A, and the voltage that can be held by the high resistivity layer 26 is the area S2 of the roughly rectangular region defined by the graph B. When T1 denotes the thickness of the drift layer 22, the area S1 satisfies the relationship of $S1 \approx T1 \cdot Ec/2$. When T2 denotes the thickness of the high resistivity layer 26 is T2, the area S2 satisfies the relationship $S2 \approx T2 \cdot Ec$. Therefore, if the thickness T2 is larger than a half of the thickness T1, the high resistivity layer 26 can hold a voltage higher than that of the drift layer 22. In the present embodiment, since the stepped portion 21 is provided, the thickness T2 of the high resistivity layer 26 is larger than a half of the thickness T1 of the drift layer 22. Therefore, the high resistivity layer 26 can hold a higher voltage than the drift layer 22. Therefore, if the potential of the lower electrode 60 is increased further from the state indicated by the dashed line 72 in FIG. 3, avalanche breakdown occurs within the drift layer 22. Since the upper electrode 62 is provided over the entire upper portion of the drift layer 22, the avalanche current is quickly discharged to the upper electrode 62 when the avalanche breakdown occurs in the drift layer 22. This reduces the stress applied to the semiconductor device 10 by the avalanche current.

Figure 5:
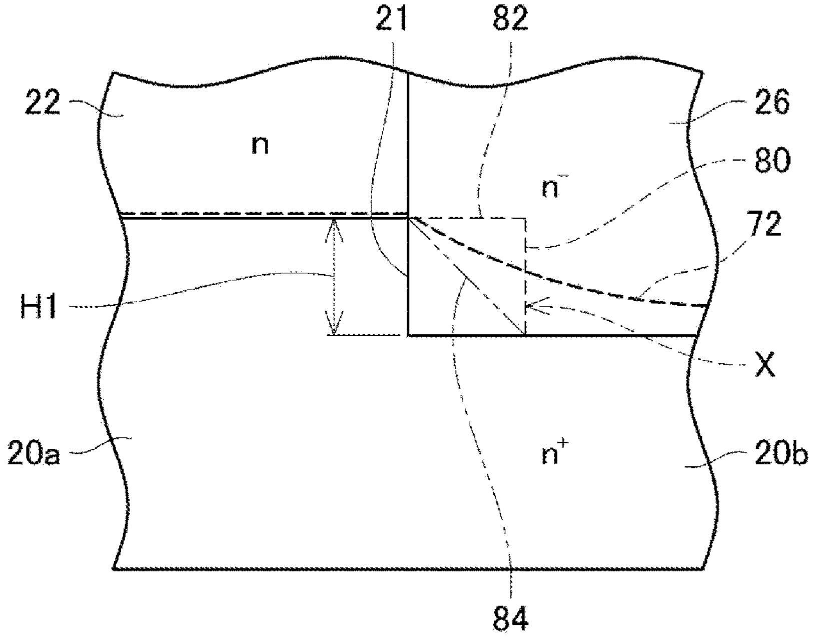
FIG. 5 is a cross-sectional view showing the distribution of the depletion layer around a stepped portion.

FIG. 5 illustrates an enlarged view of the stepped portion 21 in the state where the depletion layer is distributed as indicated by the dashed line 72 (that is, the state at the moment when the avalanche breakdown occurs). FIG. 5 illustrates a cross section of the semiconductor substrate 12 perpendicularly intersecting the stepped portion 21. A virtual line 80 in FIG. 5 is at a location shifted from the side surface of the stepped portion 21 by the same distance as the height H1 of the stepped portion 21 toward the peripheral region 40. A virtual line 82 in FIG. 5 is at a location shifted upward in a thickness direction of the semiconductor substrate 12 from the upper surface of the thin plate portion 20*b* by the same distance as the height H1 of the stepped portion 21 (in other words, an extension of the upper surface of the thick plate portion 20*a*). A region X of the cross section in FIG. 5 is a quadrilateral region surrounded by the side surface of the stepped portion 21, the upper surface of the thin plate portion 20*b*, the virtual line 80, and the virtual line 82. A virtual line 84 in FIG. 5 is a straight line that forms an angle of 45 degrees with the side surface of the stepped portion 21 and extends from the upper end of the stepped portion 21 toward the upper surface of the thin plate portion 20*b*. In other words, the virtual line 84 is the diagonal line of the quadrilateral region X. As indicated by the dashed line 72 in FIG. 5, more than a half of region X is not depleted at the moment the avalanche breakdown occurs. In particular, the region below the virtual line 84 are not depleted. The virtual line 80 corresponds to a first virtual line, and the virtual line 82 corresponds to a second virtual line.

Figure 6:
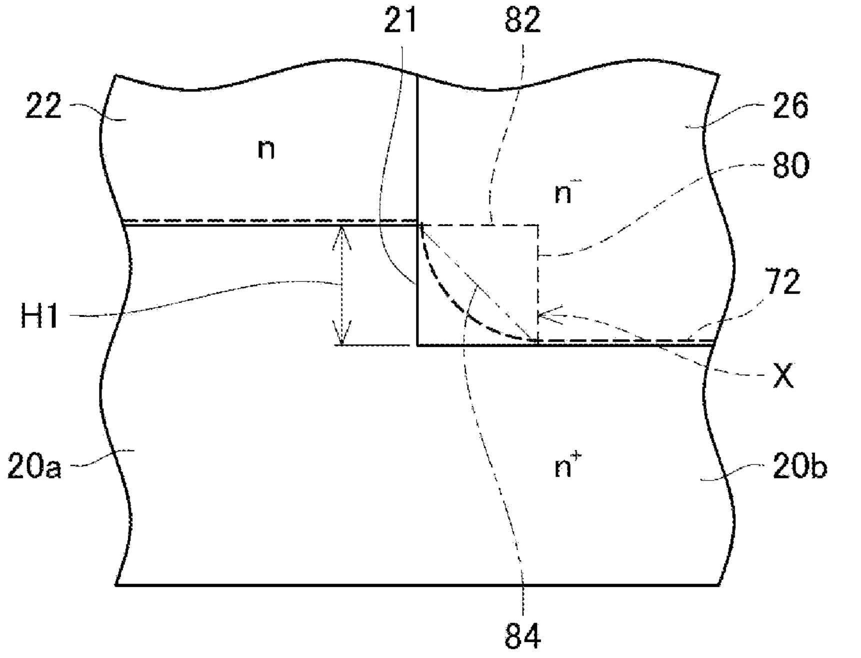
FIG. 6 is a cross-sectional view showing the distribution of a depletion layer around a stepped portion in a comparative example.

FIG. 6 illustrates the distribution of a depletion layer in a semiconductor device according to a comparative example. In FIG. 6, the dashed line 72 extends below the virtual line 84, and a half or more of the region X is depleted. When the depletion layer penetrates deeply into the region X in this manner, the upper end of the stepped portion 21 protrudes into the depletion layer, and electric field concentration occurs around the upper end of the stepped portion 21. In contrast, when the depletion layer is suppressed from entering the region X as shown in FIG. 5, the electric field concentration in the vicinity of the upper end of the stepped portion 21 is suppressed. In the present embodiment, for example, the thickness and n-type impurity concentration of the drift layer 22, the thickness and n-type impurity concentration of the high resistivity layer 26, the height of the stepped portion 21 are appropriately set, a half or more of the region X is prevented from being depleted until the occurrence of the avalanche breakdown. As a result, the electric field concentration at the upper end of the stepped portion 21 is suppressed, and the breakdown voltage of the semiconductor device 10 is improved. As described above, according to the semiconductor device 10 in the first embodiment, the thickness of the high resistivity layer 26 can be ensured by the stepped portion 21 and the electric field concentration at the upper end of the stepped portion 21 can be suppressed.

Figure 7:
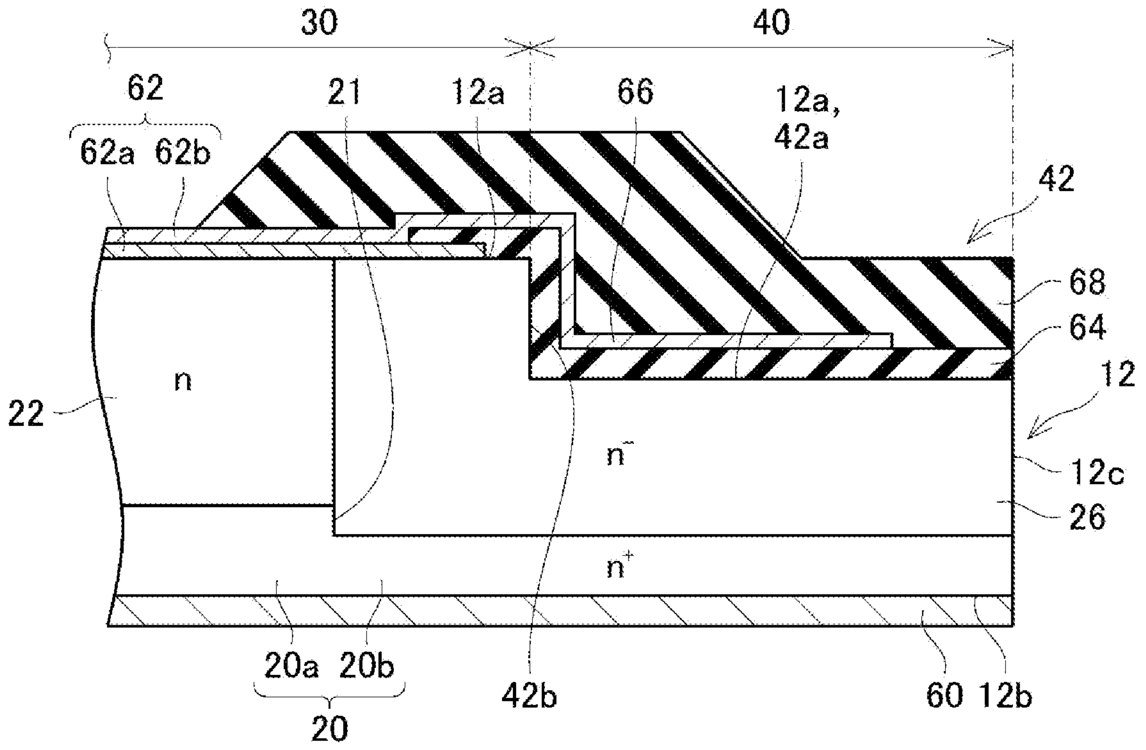
FIG. 7 is a cross-sectional view showing a modification of a first embodiment.
Figure 8:
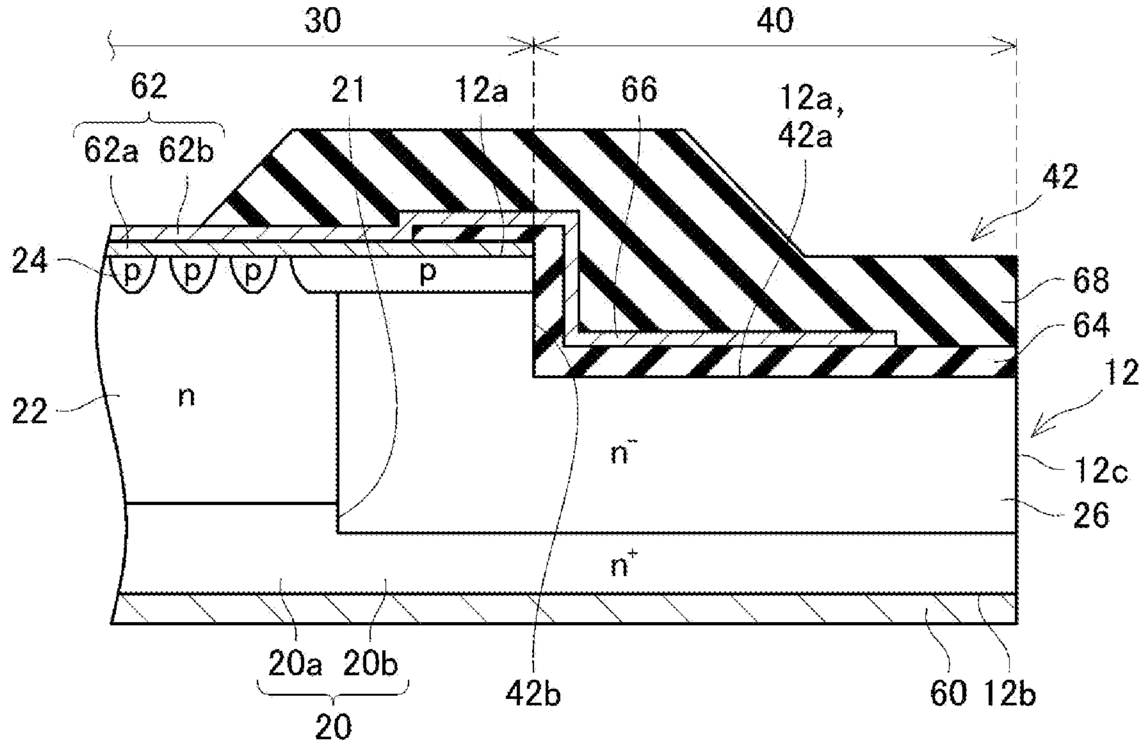
FIG. 8 is a cross-sectional view showing another modification of the first embodiment.

In the first embodiment, the drift layer 22 is connected to the upper electrode 62 via the p-n junction. However, as shown in FIG. 7, the semiconductor substrate 12 may not have the anode layer 24, and the drift layer 22 may be connected to the upper electrode 62 by a Schottky barrier junction. In this case, the element region 30 operates as a Schottky barrier diode (SBD). In the semiconductor device illustrated in FIG. 7, a depletion layer spreads from the Schottky barrier junction (that is, the interface between the upper electrode 62 and the drift layer 22) to the drift layer 22 and the high resistivity layer 26 when a reverse voltage is applied to the SBD. Even in the semiconductor device illustrated in FIG. 7, it is possible to improve the breakdown voltage by distributing the depletion layer as in FIG. 5. In addition, as shown in FIG. 8, the anode layer 24 is partially provided in the range facing the upper surface 12*a* in the element region 30, and the drift layer 22 may not be in a Schottky contact with the upper electrode 62 in the range where the anode layer 24 is not provided. Also, the semiconductor element provided in the element region 30 may be a switching element such as a metal-oxide-semiconductor field-effect transistor (MOSFET). Similarly, any semiconductor element can be provided in the element region 30 in second and third embodiments described in the following.

Second Embodiment

Figure 9:
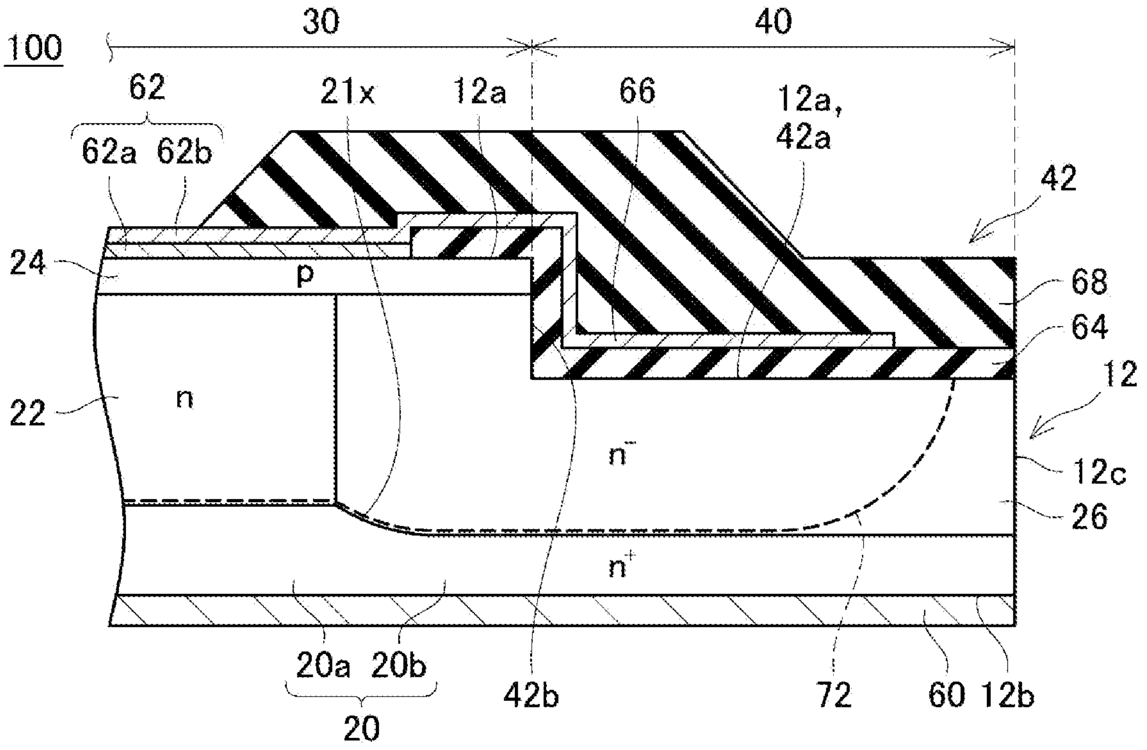
FIG. 9 is a cross-sectional view of a semiconductor device according to a second embodiment.

In a semiconductor device 100 according to a second embodiment as illustrated in FIG. 9, a displacement portion 21*x* is formed instead of the stepped portion 21 at the boundary between the thick plate portion 20*a* and the thin plate portion 20*b*. Other parts of the semiconductor device 100 according to the second embodiment are identical to the semiconductor device 10 in the first embodiment.

As shown in FIG. 9, in the displacement portion 21*x*, the upper surface of the cathode layer 20 is gradually displaced downward from the thick plate portion 20*a* toward the thin plate portion 20*b* in a thickness direction of the semiconductor device 100. Therefore, the upper surface of the thick plate portion 20*a* and the upper surface of the thin plate portion 20*b* are smoothly connected by the displacement portion 21*x*. The high resistivity layer 26 is in contact with the upper surface of the cathode layer 20 within the range of the displacement portion 21*x*. The dashed line 72 in FIG. 9 indicates the distribution of the depletion layer just before the avalanche breakdown occurs. As indicated by the dashed line 72, in the semiconductor device 100 according to the second embodiment, the lower end of the depletion layer is distributed along the displacement portion 21*x*. This prevents the depletion layer from being distributed as shown in FIG. 6. According to the structure related to the second embodiment, it is possible to suppress the electric field concentration at the boundary between the thick plate portion 20*a* and the thin plate portion 20*b*. As described above, in the semiconductor device 100 according to the second embodiment, the thickness of the high resistivity layer 26 can be ensured by the displacement portion 21*x*, and the electric field concentration at the boundary between the thick plate portion 20*a* and the thin plate portion 20*b* can be suppressed.

Third Embodiment

Figure 10:
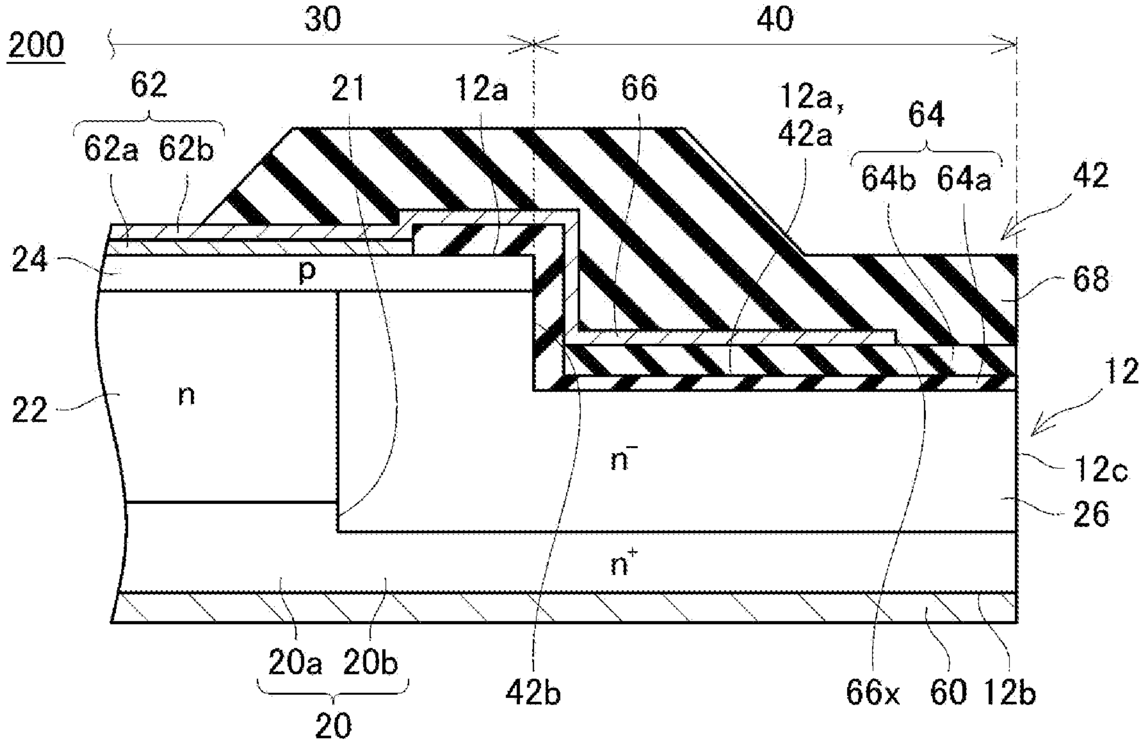
FIG. 10 is a cross-sectional view of a semiconductor device according to a third embodiment.

In a semiconductor device 200 according to a third embodiment illustrated in FIG. 10, a peripheral insulation layer 64 has a first insulation layer 64*a* and a second insulation layer 64*b*. The first insulation layer 64*a* is made of hafnium oxide. The first insulation layer 64*a* covers the bottom surface 42*a* of the recess 42, the side surface 42*b* of the recess 42, and the outer periphery of the upper surface 12*a* within the element region 30. The second insulation layer 64*a* is made of silicon oxide. The dielectric constant of silicon oxide is lower than that of hafnium oxide. The dielectric breakdown voltage of silicon oxide is higher than that of hafnium oxide. The second insulation layer 64*b* is arranged on the first insulation layer 64*a*. The field plate 66 covers the upper surface of the second insulation layer 64*b*. Therefore, the first insulation layer 64*a* and the second insulation layer 64*b* are arranged between the field plate 66 and the bottom surface 42*a* of the recess 42. An outer peripheral end 66*x* of the field plate 66 is arranged on the second insulation layer 64*b*. The peripheral insulation layer 64 between the field plate 66 and the side surface 42*b* of the recess 42 is made of a single layer being the first insulation layer 64*a*.

An electric field is easily concentrated in the vicinity of the outer peripheral end 66*x* of the field plate 66. According to the structure related to the third embodiment, since two insulation layers (that is, the first insulation layer 64*a* and the second insulation layer 64*b*) are provided between the field plate 66 and the bottom surface 42*a* of the recess 42, the spacing between the field plate 66 and bottom surface 42*a* can be enlarged. Therefore, the outer peripheral end 66*x* of the field plate 66, on which electric field concentration tends to occur, can be kept away from the high resistivity layer 26. As a result, the generation of a high electric field in the high resistivity layer 26 can be suppressed. Since a part of the peripheral insulation layer 64 is made of the first insulation layer 64*a* (that is, hafnium oxide having a high dielectric constant), the electric field inside the first insulation layer 64*a* can be relaxed. Since the peripheral insulation layer 64 is made of the second insulation layer 64*b* (that is, silicon oxide having a high dielectric breakdown voltage) at a position in contact with the outer peripheral end 66*x* of the field plate 66 where electric field concentration tends to occur, it is possible to suppress the occurrence of dielectric breakdown in the peripheral insulation layer 64 in the vicinity of the outer peripheral end 66*x*.

The peripheral insulation layer 64 between the field plate 66 and the side surface 42*b* of the recess 42 is made of a single layer being the first insulation layer 64*a*. Therefore, the field plate 66 can be arranged near the side surface 42*b* (that is, the outer periphery of the element region 30). Electric field concentration tends to occur at the outer peripheral portion of the element region 30. However, by arranging the field plate 66 near the outer peripheral portion of the element region 30, the electric field concentration at the outer peripheral portion of the element region 30 can be suppressed. Since the peripheral insulation layer 64 between the field plate 66 and the side surface 42*b* is made of the first insulation layer 64*a* (that is, hafnium oxide having a high dielectric constant), the electric field concentration in the outer peripheral portion of the element region 30 can be further effectively suppressed.

The structure of the peripheral insulation layer 64 in the third embodiment may be applied to the semiconductor device 100 according to the second embodiment.

In the third embodiment, the first insulation layer 64*a* had a higher dielectric constant than the second insulation layer 64*b*. However, the second insulation layer 64*b* may have a higher dielectric constant than the first insulation layer 64*a*.

Figure 11:
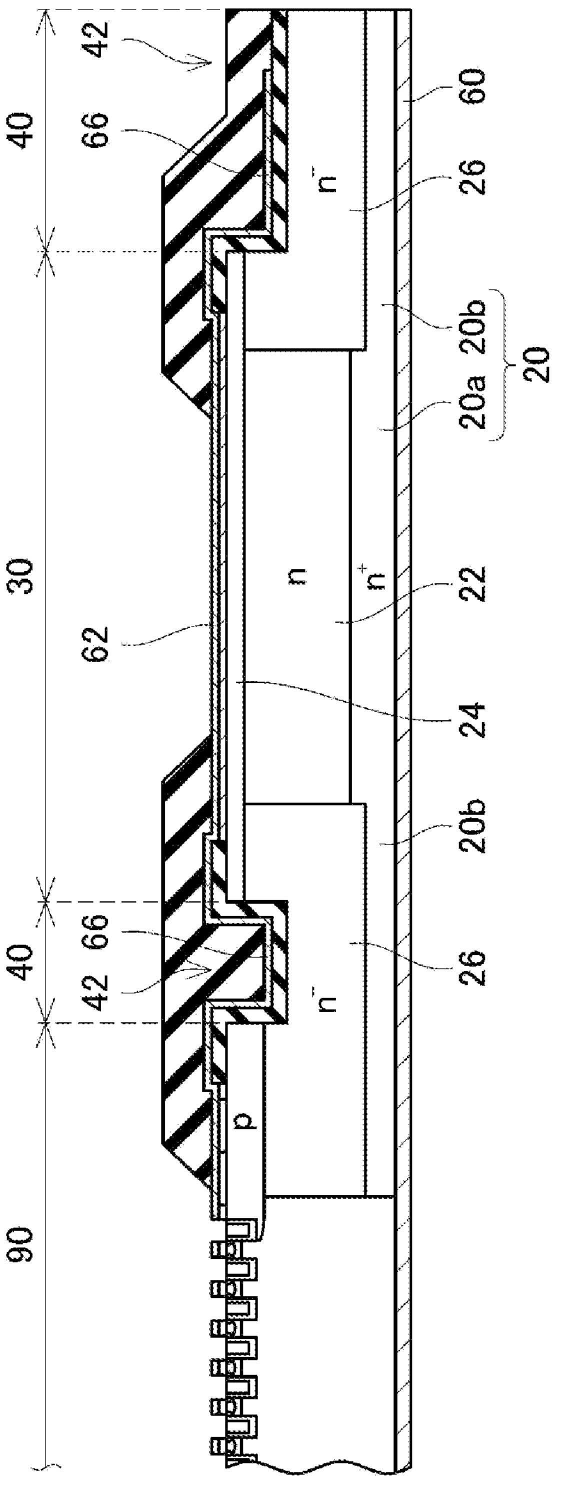
FIG. 11 is a cross-sectional view showing another modification of the first embodiment.

Further, in the first to third embodiments described above, the peripheral region 40 (that is, the recess 42) is provided in the outer peripheral portion of the semiconductor substrate 12. However, at least a part of the peripheral region 40 may be provided between the element region 30 and another region. For example, as illustrated in FIG. 11, a part of the peripheral region 40 may be provided between the element region 30 and a region 90 provided with the switching element. The diode is provided in the element region 30, and the switching element is provided in the region 90.

The cathode layer 20 in one or more of the above embodiments corresponds to a high-concentration layer. The high resistivity layer 26 in one or more of the above embodiments corresponds to a low-concentration layer.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve multiple objectives at the same time, and achieving one of the objectives itself has technical usefulness.

What is claimed is:

1. A semiconductor device comprising:

a semiconductor substrate including an element region and a peripheral region located around the element region, the semiconductor substrate having a recess located at an upper surface of the semiconductor substrate in the peripheral region such that an upper surface of the semiconductor substrate in the element region protrudes further than the upper surface of the semiconductor substrate in the peripheral region;

an upper electrode being in contact with the upper surface of the semiconductor substrate in the element region;

a lower electrode being in contact with a lower surface of the semiconductor substrate in both of the element region and the peripheral region;

an insulation layer covering a side surface and a bottom surface of the recess; and a field plate extending from the upper electrode to an upper portion of the peripheral region, the field plate being on a side of the insulation layer opposite to the side surface and the bottom surface of the recess with the insulation layer interposed between the field plate and each of the side surface and the bottom surface of the recess, wherein the semiconductor substrate includes:

a high-concentration layer being an n-type layer and extending from the element region to the peripheral region, the high-concentration layer being in contact with the lower electrode, the high-concentration layer having a thick plate portion and a thin plate portion, an upper surface of the thick plate portion protruding further than an upper surface of the thin plate portion, the thick plate portion located in the element region, the thin plate portion extending from the element region to the peripheral region;

a drift layer being an n-type layer and located in the element region, the drift layer being in contact with the upper surface of the thick plate portion in a stacking direction, the drift layer having a lower n-type impurity concentration than the high-concentration layer; and a low-concentration layer being an n-type layer and extending from the element region to the peripheral region, the low-concentration layer being in contact with a side surface of the drift layer, the low-concentration layer being in contact with the upper surface of the thin plate portion in the stacking direction, the low-concentration layer being in contact with a side surface of a stepped portion located at a boundary between the thick plate portion and the thin plate portion, the low-concentration layer being in contact with the insulation layer at the side surface and the bottom surface of the recess, the low-concentration layer having a lower n-type impurity concentration than the drift layer, the drift layer is connected to the upper electrode through at least one of a p-n junction or a Schottky barrier junction, a cross section of the semiconductor substrate perpendicularly intersects the stepped portion, the cross section of the semiconductor substrate includes a quadrilateral region surrounded by the side surface of the stepped portion, a first virtual line, the upper surface of the thin plate portion, and a second virtual line, the first virtual line is at a location shifted from the side surface of the stepped portion toward the peripheral region by a distance identical to a height of the stepped portion, the second virtual line is at a location shifted upward from the upper surface of the thin plate portion by a distance identical to the height of the stepped portion, a half or more of the quadrilateral region is not depleted in a case where an electric potential of the lower electrode with respect to the upper electrode is raised to a level causing an avalanche breakdown in the semiconductor substrate, the semiconductor substrate further includes a p-type anode layer, and a thickness of the low-concentration layer between the bottom surface of the recess and the thin plate portion is greater than one half of a thickness of the drift layer between the p-type anode layer and the thick plate portion, and is smaller than the thickness of the drift layer.

2. The semiconductor device according to claim 1, wherein the low-concentration layer includes a region below a straight line that forms an angle of 45 degrees with the side surface of the stepped portion and extends from an upper end of the stepped portion to the upper surface of the thin plate portion, and the region below the straight line is not depleted in a case where the electric potential of the lower electrode with respect to the upper electrode is raised to the level causing the avalanche breakdown in the semiconductor substrate.

3. A semiconductor device comprising:

a semiconductor substrate including an element region and a peripheral region located around the element region, the semiconductor substrate having a recess located at an upper surface of the semiconductor substrate in the peripheral region such that an upper surface of the semiconductor substrate in the element region protrudes further than the upper surface of the semiconductor substrate in the peripheral region;

an upper electrode being in contact with the upper surface of the semiconductor substrate in the element region;

a lower electrode being in contact with a lower surface of the semiconductor substrate in both of the element region and the peripheral region;

an insulation layer covering a side surface and a bottom surface of the recess; and a field plate extending from the upper electrode to an upper portion of the peripheral region, the field plate being on a side of the insulation layer opposite to the side surface and the bottom surface of the recess with the insulation layer interposed between the field plate and each of the side surface and the bottom surface of the recess, wherein the semiconductor substrate includes:

a high-concentration layer being an n-type layer and extending from the element region to the peripheral region, the high-concentration layer being in contact with the lower electrode, the high-concentration layer having a thick plate portion and a thin plate portion, an upper surface of the thick plate portion protruding further than an upper surface of the thin plate portion, the thick plate portion located in the element region, the thin plate portion extending from the element region to the peripheral region;

a drift layer being an n-type layer and located in the element region, the drift layer being in contact with the upper surface of the thick plate portion, the drift layer having a lower n-type impurity concentration than the high-concentration layer; and a low-concentration layer being an n-type layer and extending from the element region to the peripheral region, the low-concentration layer being in contact with a side surface of the drift layer, the low-concentration layer being in contact with the upper surface of the thin plate portion, the low-concentration layer being in contact with the insulation layer at the side surface and the bottom surface of the recess, the low-concentration layer having a lower n-type impurity concentration than the drift layer, the drift layer is connected to the upper electrode through at least one of a p-n junction or a Schottky barrier junction, the high-concentration layer has a displacement portion in which an upper surface of the high-concentration layer gradually descends from the thick plate portion to the thin plate portion at a boundary between the thick plate portion and the thin plate portion, and the low-concentration layer is in contact with the upper surface of the high-concentration layer in the displacement portion.

4. The semiconductor device according to claim 1, wherein the insulation layer includes:

a first insulation layer being in contact with the bottom surface of the recess; and a second insulation layer located on the first insulation layer, a dielectric constant of the first insulation layer is different from a dielectric constant of the second insulation layer, and the first insulation layer and the second insulation layer are located between the field plate and the bottom surface of the recess.

5. The semiconductor device according to claim 4, wherein the dielectric constant of the first insulation layer is larger than the dielectric constant of the second insulation layer, and an insulation breakdown voltage of the second insulation layer is larger than an insulation breakdown voltage of the first insulation layer.

6. The semiconductor device according to claim 4, wherein the insulation layer between the field plate and the side surface of the recess is made of the first insulation layer or the second insulation layer.

7. The semiconductor device according to claim 6, wherein one of the first insulation layer and the second insulation layer has a larger dielectric constant than another one of the first insulation layer and the second insulation layer, and the insulation layer between the field plate and the side surface of the recess is made of the one of the first insulation layer and the second insulation layer.

8. The semiconductor device according to claim 1, wherein the p-type anode layer is in contact with an upper surface of the drift layer and an upper surface of the low-concentration layer in the element region.

9. The semiconductor device according to claim 8, wherein the p-type anode layer is in ohmic contact with the upper electrode.

10. The semiconductor device according to claim 1, wherein the p-type anode layer is located between the drift layer and the upper electrode and between the low-concentration layer and the upper electrode in the element region.

11. The semiconductor device according to claim 1, wherein an n-type impurity concentration of the drift layer is set to a concentration such that the drift layer has a triangular electric field distribution having one side defined by an upper surface of the drift layer and another side extending in the stacking direction from the one side, and an n-type impurity concentration of the low-concentration layer is set to a concentration such that the low-concentration layer has a quadrilateral electric field distribution having a first side defined by the bottom surface of the recess, a second side defined by the upper surface of the thin plate portion, and a third side extending in the stacking direction from the first side to the second side.

* * * * *